United States Patent
Kolman et al.

(10) Patent No.: US 7,421,360 B2
(45) Date of Patent: Sep. 2, 2008

(54) METHOD AND APPARATUS FOR HANDLING A USER-DEFINED EVENT THAT IS GENERATED DURING TEST OF A DEVICE

(75) Inventors: Robert Stanley Kolman, Longmont, CO (US); Reid Hayhow, La Porte, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 10 days.

(21) Appl. No.: 11/345,043

(22) Filed: Jan. 31, 2006

(65) Prior Publication Data

US 2007/0179732 A1 Aug. 2, 2007

(51) Int. Cl.
*G06F 19/00* (2006.01)
*G06F 17/40* (2006.01)

(52) U.S. Cl. ............. 702/108; 702/127; 702/189; 707/102

(58) Field of Classification Search ............. 702/108, 702/127, 188, 189; 707/1, 7, 101, 102; 715/505, 715/507, 508
See application file for complete search history.

(56) References Cited

U.S. PATENT DOCUMENTS

| | | | | |
|---|---|---|---|---|
| 4,525,789 A | * | 6/1985 | Kemper et al. | 702/117 |
| 5,121,469 A | * | 6/1992 | Richards et al. | 345/595 |
| 5,818,603 A | * | 10/1998 | Motoyama | 358/296 |
| 6,330,628 B1 | * | 12/2001 | Motoyama | 710/105 |
| 6,553,107 B2 | * | 4/2003 | Jarvi et al. | 379/114.03 |
| 6,606,304 B1 | * | 8/2003 | Grinter et al. | 370/252 |
| 6,839,716 B1 | * | 1/2005 | Della-Libera et al. | 707/103 R |
| 6,934,596 B2 | * | 8/2005 | Yoshida et al. | 700/109 |
| 7,107,114 B2 | * | 9/2006 | Yoshida et al. | 700/108 |
| 7,111,075 B2 | * | 9/2006 | Pankovcin et al. | 709/246 |

(Continued)

FOREIGN PATENT DOCUMENTS

EP 0 798 904 A2 * 10/1997

(Continued)

OTHER PUBLICATIONS

"Standard Test Data Format (STDF) Specification, Version 4"; ATE; Dec. 1995; pp. i-iii, 1-12, 62 and 63.

*Primary Examiner*—Edward R Cosimano
(74) *Attorney, Agent, or Firm*—Holland & Hart, LLP

(57) ABSTRACT

In one embodiment, and in response to an ordered sequence of events corresponding to execution of a plurality of tests on at least one device under test (DUT), 1) a plurality of data objects are created, the data objects including A) some data objects that correspond to logical groupings of test results implied by ones of the events, and B) a generic data object that corresponds to a user-defined one of the events; 2) ones of the data objects are related to others of the data objects in a hierarchical tree structure, with the generic data object being related to others of the data objects based on the position of the user-defined event in the ordered sequence of events; and 3) data corresponding to ones of the events is related to ones of the data objects in the hierarchical tree structure. A number of data formatters are provided access to the plurality of data objects and data associated with the hierarchical tree structure. Other embodiments are also disclosed.

8 Claims, 5 Drawing Sheets

U.S. PATENT DOCUMENTS

| | | | |
|---|---|---|---|
| 7,171,670 B2* | 1/2007 | Motoyama et al. | 719/310 |
| 7,287,085 B1* | 10/2007 | Motoyama et al. | 709/230 |
| 2001/0040897 A1* | 11/2001 | Hamlin | 370/466 |
| 2002/0078216 A1* | 6/2002 | Pankovcin et al. | 709/230 |
| 2003/0176939 A1* | 9/2003 | Yoshida et al. | 700/109 |
| 2003/0217027 A1* | 11/2003 | Farber et al. | 707/1 |
| 2004/0030523 A1* | 2/2004 | Banfer | 702/108 |
| 2005/0010606 A1* | 1/2005 | Kaiser et al. | 707/200 |
| 2005/0192695 A1* | 9/2005 | Yoshida et al. | 700/108 |
| 2006/0090139 A1* | 4/2006 | Jenni et al. | 715/760 |
| 2006/0104501 A1* | 5/2006 | Jiang et al. | 382/152 |
| 2006/0174170 A1* | 8/2006 | Garland et al. | 714/57 |
| 2006/0259392 A1* | 11/2006 | Rabenold et al. | 705/37 |
| 2007/0011169 A1* | 1/2007 | Parisi | 707/10 |
| 2007/0027951 A1* | 2/2007 | Motoyama et al. | 709/203 |
| 2007/0033266 A1* | 2/2007 | Motoyama et al. | 709/218 |
| 2007/0033267 A1* | 2/2007 | Motoyama et al. | 709/218 |
| 2007/0033268 A1* | 2/2007 | Motoyama et al. | 709/218 |
| 2007/0100858 A1* | 5/2007 | Milstead et al. | 707/101 |
| 2007/0260938 A1* | 11/2007 | Connally et al. | 714/45 |

FOREIGN PATENT DOCUMENTS

| | | | |
|---|---|---|---|
| JP | 62-118655 A | * | 5/1987 |
| JP | 01-255355 A | * | 10/1989 |
| WO | WO 00/54308 A2 | * | 8/2000 |

* cited by examiner

| Line | Event Logged | Data |
|---|---|---|
| 1 | Start Lot Level | |
| 2 |    Variable Assignment | Lot_id=1 |
| 3 |    Start Device Level | |
| 4 |       Variable Assignment | Device_id=a |
| 5 |       Device tested | <test results for device "a"> |
| 6 |       Start User-defined Level | |
| 7 |          User-defined event | <data> |
| 8 |       End User-defined Level | |
| 9 |       Variable Assignment | Device_id=b |
| 10 |       Device tested | <test results for device "b"> |
| 11 |       Variable Assignment | Device_id=c |
| 12 |       Device tested | <test results for device "c"> |
| 13 |    End Device Level | |
| 14 | End Lot Level | |
| 1 | Start Lot Level | |
| 2 |    Variable Assignment | Lot_id=2 |
| 3 |    Start Device Level | |
| 4 |       Variable Assignment | Device_id=d |
| 5 |       Device tested | <test results for device "d"> |
| 6 |       Start User-defined Level | |
| 7 |          User-defined event | <data> |
| 8 |       End User-defined Level | |
| 9 |       Variable Assignment | Device_id=e |
| 10 |       Device tested | <test results for device "e"> |
| 11 |       Variable Assignment | Device_id=f |
| 12 |       Device tested | <test results for device "f"> |
| 13 |    End Device Level | |
| 14 | End Lot Level | |

FIG. 4

METHOD AND APPARATUS FOR HANDLING A USER-DEFINED EVENT THAT IS GENERATED DURING TEST OF A DEVICE

BACKGROUND

During test of a device, and especially a circuit, the execution of a test program for testing the device may result in the generation of a plurality of test events, as well as attributes for the test events (such as test results and other data items).

Typically, a user must create a test program using a plurality of predefined test events and attributes. Sometimes, however, the predefined test events and attributes do not allow the user to generate the type of data they want to acquire.

SUMMARY OF THE INVENTION

In one embodiment, apparatus comprises a data populator and a data formatter. The data populator is provided to 1) receive an ordered sequence of events corresponding to execution of a plurality of tests on at least one device under test (DUT), 2) create a plurality of data objects, including some data objects that correspond to logical groupings of test results implied by ones of the events, and a generic data object that corresponds to a user-defined one of the events, 3) relate ones of the data objects to others of the data objects in a hierarchical tree structure, with the generic data object being related to others of the data objects based on the position of the user-defined event in the ordered sequence of events, and 4) relate data corresponding to ones of the events to ones of the data objects in the hierarchical tree structure. The data formatter is provided to retrieve and format data associated with the hierarchical tree structure, the data formatter retrieving data associated with the generic data object.

In another embodiment, a method comprises, in response to an ordered sequence of events corresponding to execution of a plurality of tests on at least one device under test (DUT), 1) creating a plurality of data objects including A) some data objects that correspond to logical groupings of test results implied by ones of the events, and B) a generic data object that corresponds to a user-defined one of the events; 2) relating ones of the data objects to others of the data objects in a hierarchical tree structure, with the generic data object being related to others of the data objects based on the position of the user-defined event in the ordered sequence of events; and 3) relating data corresponding to ones of the events to ones of the data objects in the hierarchical tree structure. The method also comprises providing a number of data formatters access to the plurality of data objects and data associated with the hierarchical tree structure.

In yet another embodiment, apparatus comprises computer readable code stored on the computer readable media. The code comprises code to, in response to receiving an ordered sequence of events corresponding to execution, 1) create a plurality of data objects including A) some data objects that correspond to logical groupings of test results implied by ones of the events, and B) a generic data object that corresponds to a user-defined one of the events; 2) relate ones of the data objects to others of the data objects in a hierarchical tree structure, with the generic data object being related to others of the data objects based on the position of the user-defined event in the ordered sequence of events; and 3) relate data corresponding to ones of the events to ones of the data objects in the hierarchical tree structure. The code also comprises code to provide a number of data formatters access to the plurality of data objects and data associated with the hierarchical tree structure.

Other embodiments are also disclosed.

BRIEF DESCRIPTION OF THE DRAWINGS

Illustrative embodiments of the invention are illustrated in the drawings, in which:

FIG. 4 illustrates exemplary contents of an EDL file used by the system shown in FIG. 3.

DETAILED DESCRIPTION

Figure 1:
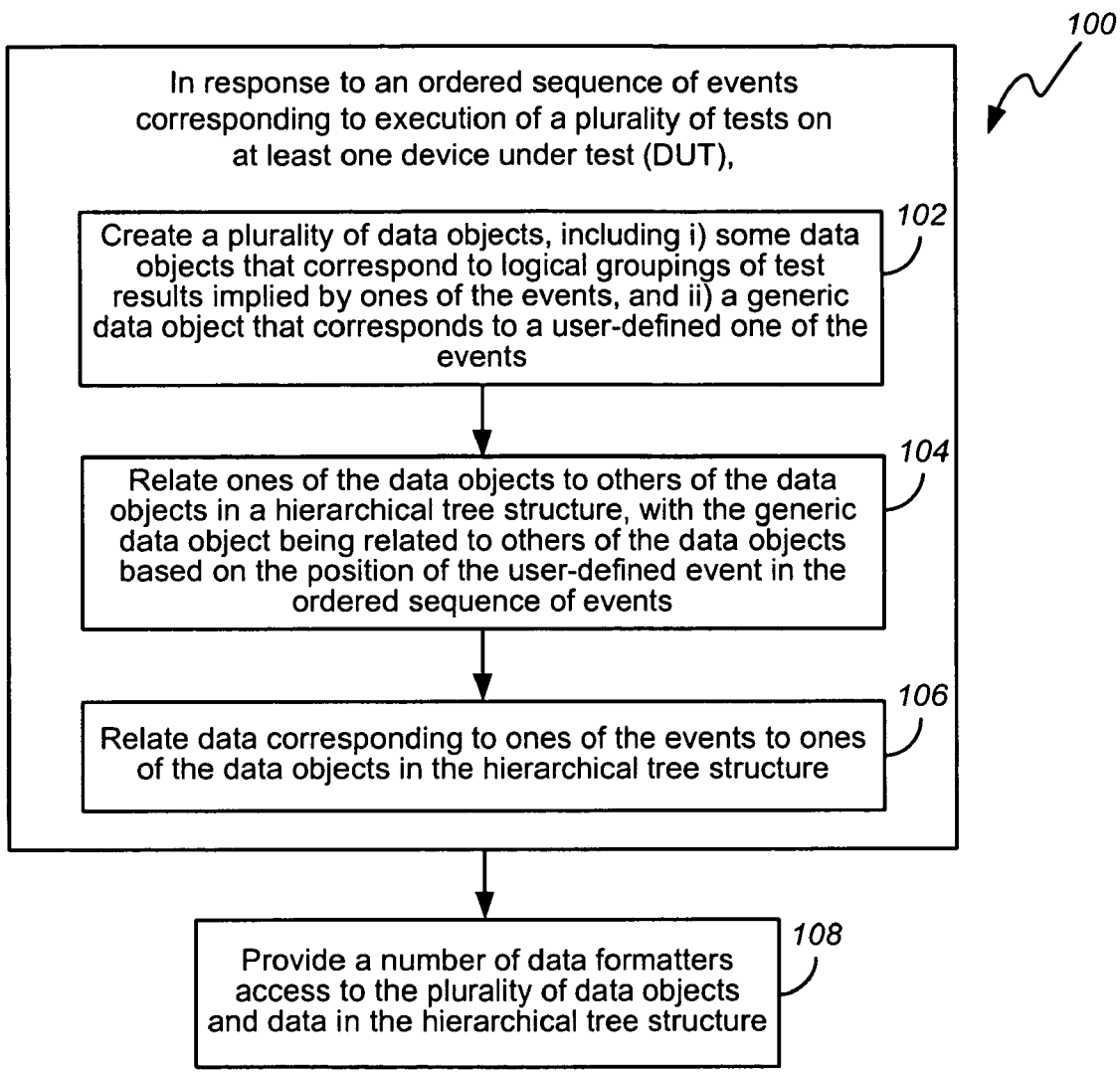
FIG. 1 illustrates an exemplary method for storing and formatting data.

As a preliminary manner, it is noted that, in the following description, like reference numbers appearing in different drawing figures refer to like elements/features. Often, therefore, like elements/features that appear in different drawing figures will not be described in detail with respect to each of the drawing figures.

To improve the manner in which data is formatted by a plurality of data formatters, FIG. 1 illustrates an exemplary method 100 for storing data that is to be accessed by the plurality of data formatters. The method 100 proceeds as follows. In response to an ordered sequence of events corresponding to execution of a plurality of tests on at least one device under test (DUT), a plurality of data objects are created at step 102. By way of example, and in the realm of circuit test, the events might comprise events to signal the loading or unloading of a new wafer, events to signal the start or end of testing for a particular device on the wafer, and evens to signal the starts and ends of different tests and subtests.

At least some of the data objects created by the method 100 correspond to logical groupings of test results that are implied by ones of the events (e.g., lot objects, wafer objects, DUT objects, and test and/or subtest objects, to name a few). As used in this description, "implied" groupings can be those that are specifically mentioned, or those that are only inferred. In any case, it is preferable that the logical groupings correspond to real-world groupings that can be understood by an engineer or user that is tasked with formatting data (or tasked with creating a data formatter for formatting the data).

Others of the data objects created by the method 100 may be generic data objects that correspond to one or more user-defined events in the sequence of events. The user-defined events may take various forms, and thus the generic data object may be configured in various ways, as will be described in greater detail later in this description.

After creating one or more of the data objects, ones of the data objects are related to others of the data objects in a hierarchical tree structure at step 104. The generic data object (s) are related to others of the data objects based on the position(s) of user-defined events in the ordered sequence of events.

In step 106, data corresponding to ones of the events, including test results, is related to ones of the data objects in the hierarchical tree structure.

Although the hierarchical tree structure is not required to be stored in memory, it will most always be advantageous to do so, as this significantly speeds data creation/retrieval processes.

During or after creation of the data objects, a number of data formatters (i.e., one or more data formatters) is provided access to the plurality of data objects and data in the hierarchical tree structure. See step 108.

In one embodiment, each of a number of active ones of the data formatters access the data objects and data associated with the hierarchical tree structure, format the data in accord with rules that are maintained by the data formatter, and then write formatted data to a file. For purposes of this description, an "active" data formatter is one of a number of "available" data formatters that a user has selected to format a particular data set. If the method 100 is applied to circuit test, one or more of the data formatters may write data as a number of test records.

It is noted that the order of the method steps shown in FIG. 1 is not critical, and other orders of the steps, including parallel processing of the steps, is possible.

The method 100 shown in FIG. 1 may be implemented by means of computer readable code stored on computer readable media. The computer-readable media may include, for example, any number or mixture of fixed or removable media (such as one or more fixed disks, random access memories (RAMs), read-only memories (ROMs), or compact discs), at either a single location or distributed over a network. The computer readable code will typically comprise software, but could also comprise firmware or a programmed circuit.

Figure 2:
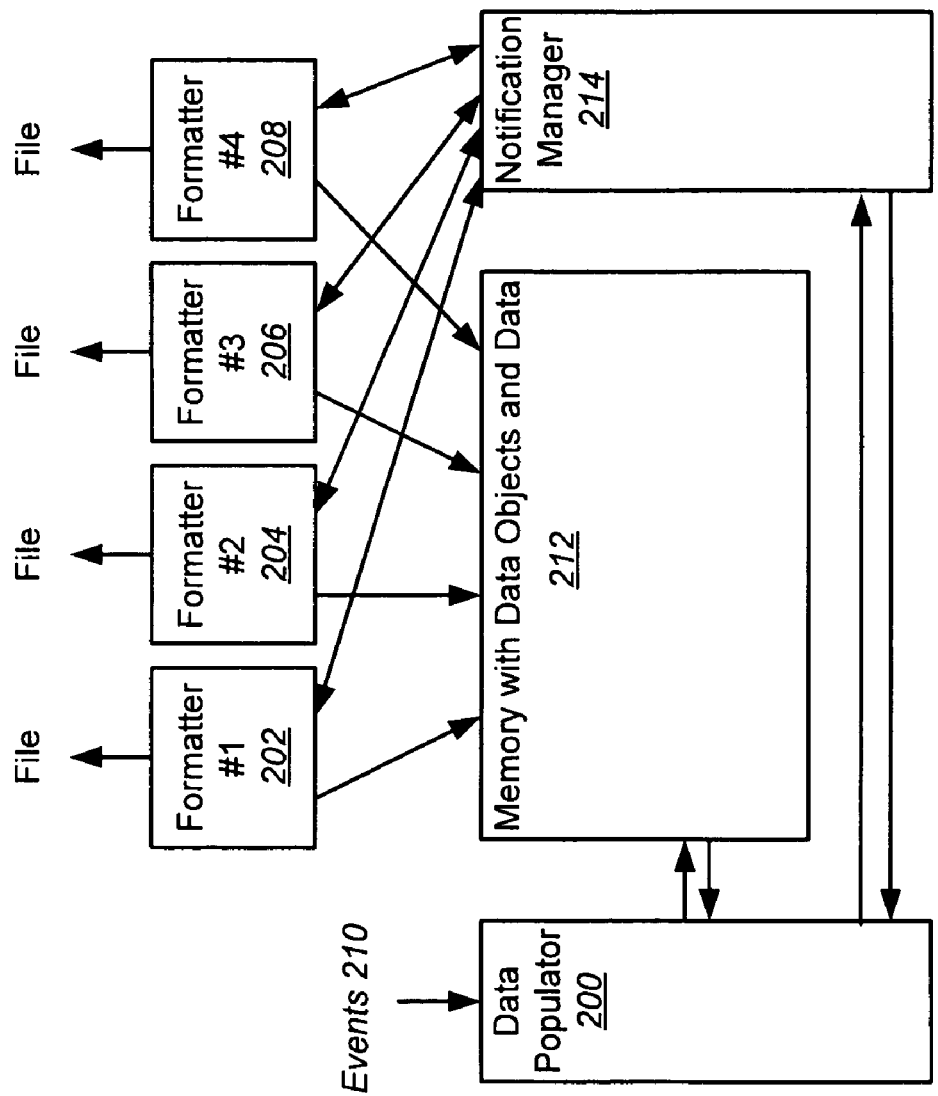
FIG. 2 illustrates various functional units (or processes) that may be instantiated or run as a result of executing the method shown in FIG. 1.

In one embodiment, the computer readable code that implements the method 100 may cause the functional units (or processes) shown in FIG. 2 to be instantiated or run. The functional units comprise a data populator 200 and a number of data formatters 202, 204, 206, 208, as well as other optional components. However, it is noted that the boundaries between the various functional units are somewhat amorphous, and certain functions that are described below could alternately be performed by different ones of the functional units, or the functions of two or more units could be combined into a single functional unit (or process).

The data populator 200 1) receives a plurality of events 210, 2) creates a plurality of data objects in memory 212, 3) relates data corresponding to ones of the events to ones of the data objects, and 4) stores the data in the memory 212. At least some of the data objects created by the data populator 200 correspond to logical groupings of data that are implied by ones of the events received by the data populator 200. For purposes of this disclosure, "implied" groupings include those that are specifically "expressed".

The number of data formatters 202, 204, 206, 208 access ones of the data objects, and then retrieve and format the data that is related to the data objects.

In one embodiment, computer readable code may further instantiate or run a notification manager 214. The notification manager 214 may receive indications of events from the data populator 200, and in response to these indications, may provide notifications of ones of the events to one or more of the data formatters 202, 204, 206, 208. The data formatters 202, 204, 206, 208 may then be configured to initiate their access of data objects (and retrieval of data) in response to the notifications. Note that, in some cases, the indications of events received by the notification manager 214 may correspond to fewer or different events than those that are received by the data populator 200. For example, in the case of circuit test, the data populator 200 may receive indications of test setup events that are not deemed sufficiently important to pass to the notification manager 214, and that are not used as a basis for creating data objects. Also, there may be events that the data populator 200 infers from the events it receives. For example, based on a change in part numbers or other indicia, the data populator 200 might infer that a new "lot" of devices is being tested, and then provide an indication of such event to the notification manager 214 (i.e., even though the data populator 200 itself might not receive a new "lot" event).

The method 100 and apparatus disclosed above can be used in many applications. In one particular application, the method 100 and apparatus are used to format test results generated by a 93000 SOC Series tester offered by Agilent Technologies, Inc.

The 93000 SOC Series tester (hereinafter referred to as the "93000 tester") is an SOC (System On a Chip) tester that logs test results and events to a binary data file known as an EDL (Event Data Logging) file. The events in this EDL file correspond to the execution of a plurality of tests on at least one device under test (DUT), and are stored in an ordered sequence. However, the events stored in the EDL file are not "thrown" to any other process, and are merely logged to the EDL file. In such an application, the method 100 shown in FIG. 1 may further comprise the steps of 1) parsing a data file corresponding to a plurality of events (e.g., an EDL file), to retrieve the plurality of events, and then 2) passing the events retrieved from the data file to a process (e.g., the data populator 200 shown in FIG. 2) that creates the plurality of data objects and stores data in memory 212.

Figure 3:
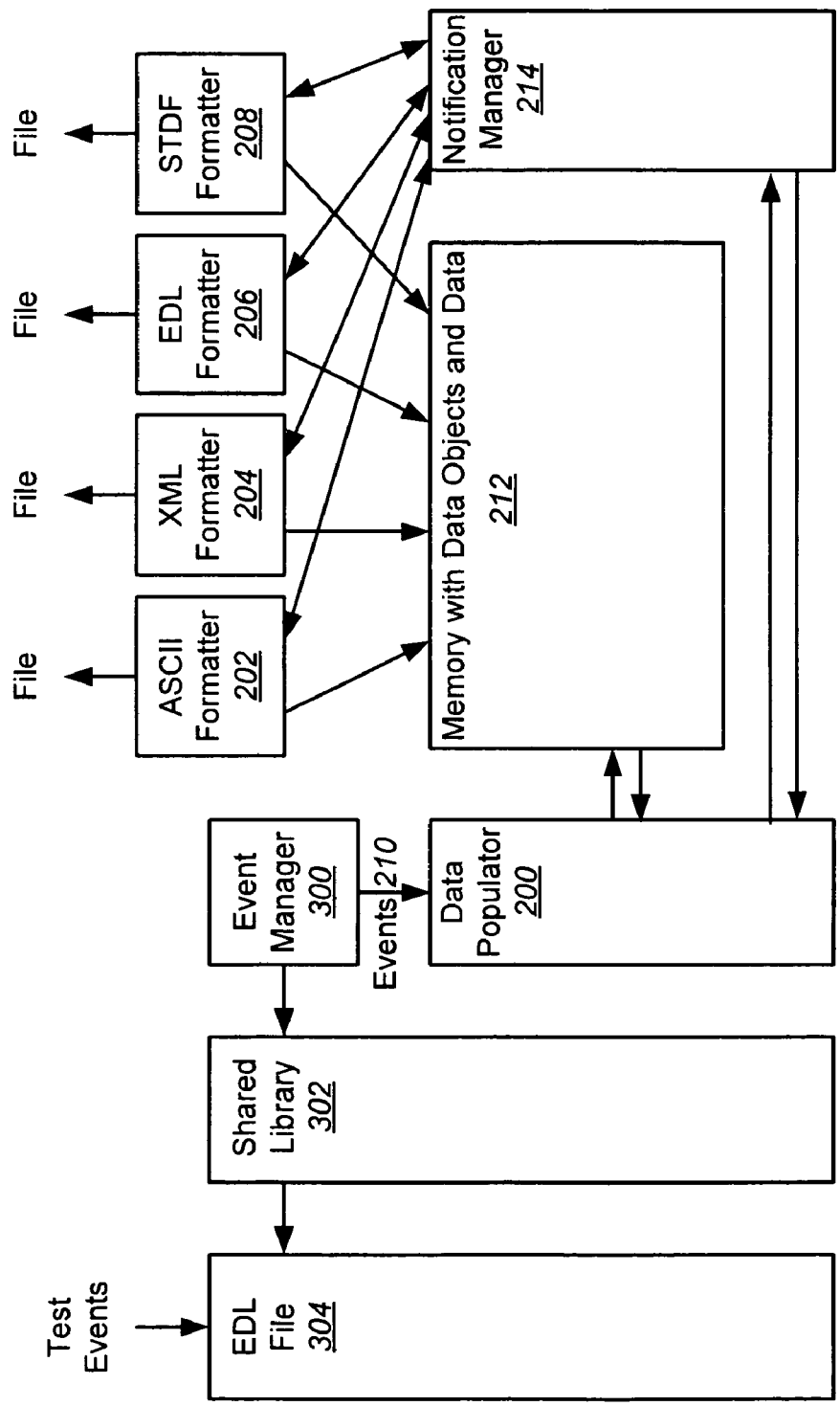
FIG. 3 illustrates a variation of the system shown in FIG. 2, the system being particularly suited for use in a test environment.

In one embodiment, the EDL file is parsed in response to method calls made by an event manager. As shown in FIG. 3, the event manager 300 may make method calls (e.g., get event; get event attribute) to a shared library 302, and the shared library 302 may then retrieve events from the EDL file 304 and "throw" them to the event manager 300. The event manager 300 then passes the events to the data populator 200.

The shared library 302 may take the form of compiled code, such as a data retrieval library (DRL), that executes a method or methods when called by the event manager 300.

The data objects that are created in memory 212 are related to one another in a hierarchical tree structure. Data objects that are children of other data objects may maintain pointers to their parent data objects, but parent objects need not maintain a list of pointers to all of their children. As will be explained later in this description, these pointers from children to their parents can aid the process of deleting data objects that are no longer needed.

In the case of data objects that are based on the execution of a plurality of circuit tests, the logical groupings of data (e.g., groupings of test results) that are implied by the events may comprise one or more hardware groupings, such as groupings for lots, wafers and DUTs, and one or more test groupings, such as groupings of test results corresponding to tests and subtests.

Data may be related to data objects in various ways, including, by 1) directly storing data within the data objects, or 2) storing data in data structures that are related to the data objects (e.g., related by pointers or other means).

In an EDL file 304, data is stored as attributes of events. Thus, if the data populator 200 receives events drawn from an EDL file 304, the data populator 200 may extract data corresponding to events by extracting the data from attributes of the events. In the case of circuit test, the extracted data may comprise test results.

Figure 5:
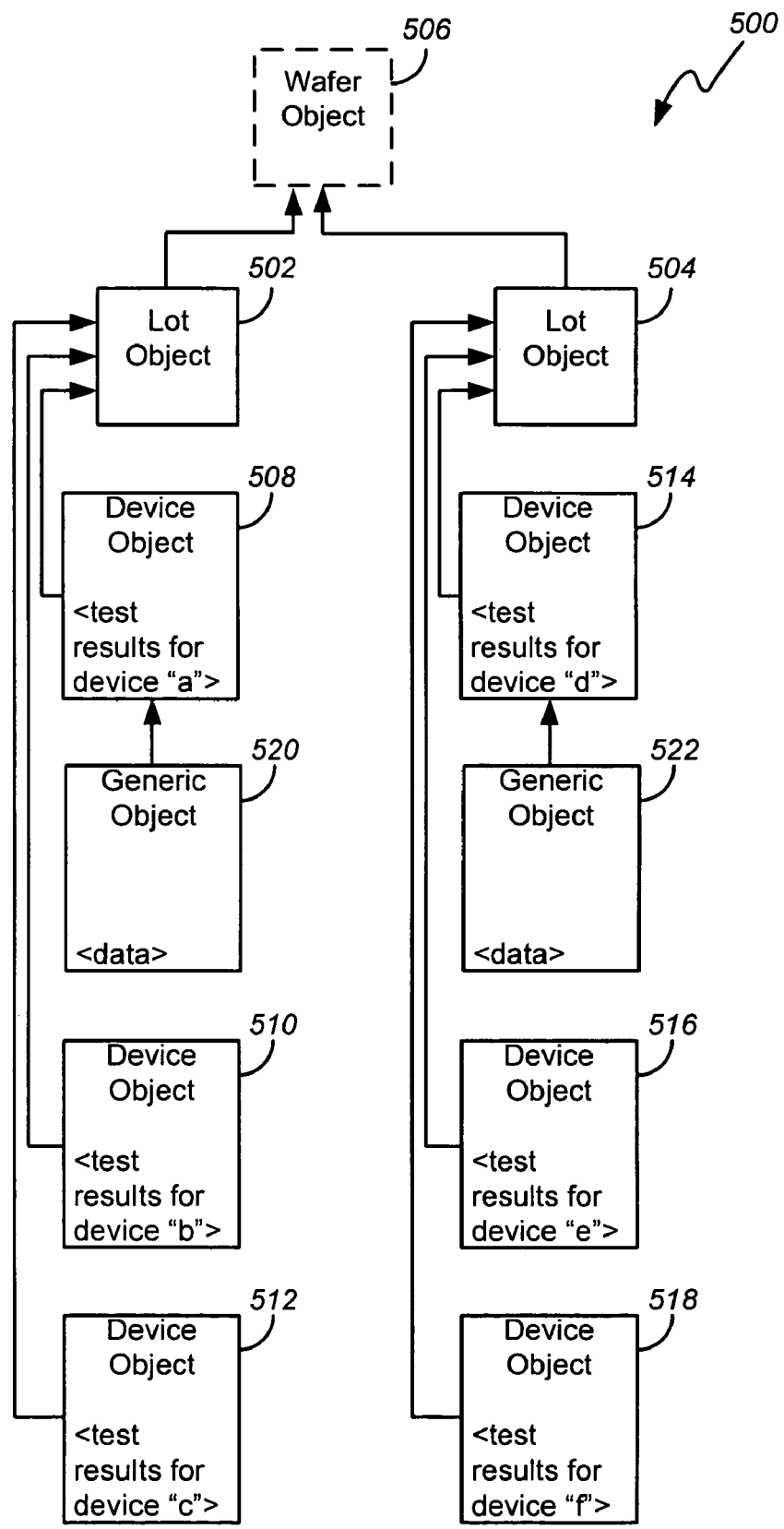
FIG. 5 illustrates an exemplary hierarchical tree structures for storing the contents of the EDL file shown in FIG. 4.

By way of example, FIG. 4 illustrates an exemplary embodiment of the contents of the EDL file 304, where some of the data comprises tests results, and some of the data associated with logged events comprises user-defined data. FIG. 5 illustrates an exemplary hierarchical tree structure 500 that the data populator 200 might create from the contents of the EDL file 304 shown in FIG. 4. The tree structure 500 comprises two lot objects 502, 504 (each of which may maintain a pointer to a parent "wafer object" 506) and six device objects 508, 510, 512, 514, 516, 518 (each of which maintains a pointer to a respective one of the lot objects 502, 504). As shown, available test results are associated with each of the device objects 508, 510, 512, 514, 516, 518. The tree structure 500 also comprises two generic objects 520, 522, each of which is related to a particular one of the device objects 508, 514 based on the positions of the user-defined events in the EDL file 304 (FIG. 4).

In addition to storing individual data items in the memory 212, the data populator 200 may accumulate data statistics, such as test data statistics, and then relate the data statistics to ones of the data objects (e.g., by storing the data statistics within the data objects, or by storing the data statistics in data structures that are related to the data objects). In one embodiment, the data statistics may be accumulated by the data populator 200 and then related to a data object when fully compiled. In an alternate embodiment, incomplete data statistics may be related to data objects and then updated. Similarly to data statistics, the data populator 200 may accumulate data interpretations, such as test data interpolations, and relate them to ones of the data objects.

The choice of whether to have the data populator 200 or individual data formatters 202, 204, 206, 208 compile statistics and/or interpret data may be based on the usefulness of the statistic or interpretation in different data formats. That is, if a statistic or interpretation is likely to be needed by multiple data formatters 202, 204, 206, 208, it is often best to have the statistic or interpretation compiled once by the data populator 200. On the other hand, statistics and interpretations that are format-specific may best be compiled by a particular one of the data formatters 202, 204, 206, 208.

There are many ways in which the data formatters 202, 204, 206, 208 may access the data objects and data that are created by the data populator 200. In one embodiment, the data formatters 202, 204, 206, 208 can simply monitor the data objects. However, this can require a lot of memory bandwidth, and is often not very efficient. In a preferred embodiment, the data populator 200 generates pointers to the data objects that it creates, and then passes the pointers to the notification manager 214. The notification manager 214 then distributes ones of the pointers to ones of the data formatters 202, 204, 206, 208.

It is noted that that the notification manager 214 need only receive one pointer to each data object. The notification manager 214 can then replicate the pointer, or broadcast it, to each of the data formatters 202, 204, 206, 208. Alternately, the notification manager 214 may not replicate or broadcast the pointer for/to each of the data formatters 202, 204, 206, 208, and may only replicate or broadcast the pointer for/to certain ones of the data formatters 202, 204, 206, 208 that have subscribed for a type of data that is represented by the data object.

Typically, the operation of the data populator 200 will be given priority over the operation of the data formatters 202, 204, 206, 208. To further control access to the memory 212 in which the data objects and data are stored, the data populator 200 (or other process that creates the plurality of data objects and stores data in the memory 212) may be provided with direct access to the data objects and the data. However, the number of data formatters 202, 204, 206, 208 may be provided with access to the plurality of data objects via a structured interface that coordinates/arbitrates the data formatters' access to the data objects and data.

To reduce the number of data objects that is maintained in the memory 212, the data populator 200 may monitor reservations of the data objects, and may delete data objects that are no longer reserved by any object or process that references or accesses the data objects. In one embodiment, a data object is considered reserved when a pointer is generated to reference the data object. The data populator 200 may generate one such pointer upon creation of the data object, and the notification manager 214 may generate and distribute additional copies of this pointer to the data formatters 202, 204, 206, 208. The data populator 200 may also generate a pointer to an object when a child object of the data object is created. As pointers are generated, a count of the number of pointers that reference a particular data object may be maintained (possibly within the data object itself). The data formatters 202, 204, 206, 208 and other processes can then be programmed to relinquish their pointer to a data object when they have finished accessing the data object, and the data populator 200 can delete the data object when all such pointers have been released. Due to child objects referencing their parents, a parent object cannot be deleted until all of its children are first deleted.

The data formatters shown in FIG. 3 may take various forms, including forms such as an ASCII (American Standard Code for Information Interchange) formatter 202, an XML (extensible Markup Language) formatter 204, an EDL formatter 206 and/or an STDF (Standard Test Definition Format) formatter 208.

When retrieving a generic data object from the memory 212, one or more of the data formatters 202, 204, 206, 208 may format the data associated with the generic data object in accord with a user-defined record type that corresponds to a user-defined event. Or, one or more of the data formatters 202, 204, 206, 208 may format the data associated with a generic data object in accord with a generic record type. For example, an STDF formatter 208 might format the data associated with a generic data object in accord with the Generic Data Record (GDR) defined by the STDF specification.

In some cases, a generic data object may be associated with a label that specifies the type of a user-defined object. This type can then be used by one or more of the data formatters 202, 204, 206, 208 to determine what kind of format to use when formatting data associated with the generic data object. By way of example, a label might specify that a generic data object comprises debug data, or a particular kind of test data.

In one embodiment, user-defined events and generic data objects may be used to store "pieces" of data that are to be stitched together. For example, the STDF specification limits data records to 64 kilobytes of data. In cases where the data associated with an "event" might exceed this limit, user-defined events might be defined to break up a data set into smaller pieces. Labels associated with these "pieces" could then specify what part of the data is associated with a particular user-defined event, and generic data objects could be used to store all of these "pieces" of data. Once the pieces of data have been formatted using, for example, STDF GDR records, downstream analysis software or other processes can read the label parts of these records to determine how to stitch the records' data together.

Depending on their implementation, the data models disclosed herein (i.e., where data objects are created based on logical groupings of data, and/or where data objects are related to one another in a hierarchical tree structure) can provide a number of advantages—especially in the context of circuit test. For example, by providing a separate process to organize data in memory, and then making the data available to a plurality of data formatters, much of the overhead of having to read and organize data is removed from the data formatters; and, by creating data objects "in memory", they can be accessed more quickly than data stored on disk. This enables the code of the data formatters to be lighter weight, and also provides a standard data model that can be leveraged by new data formatters. It also 1) enables easier revisions and patches to the data populator and individual data formatters, 2) enables parallel and faster coding of each of these functional units, and 3) reduces the likelihood of error in coding each functional unit (e.g., because each is lighter weight, and there is less code to test for each unit). Further, it enables a tester to generate data in a form that is more efficient to generate in a run-time test environment, while making test data available to data formatters (and the authors thereof) in a form that is more user-friendly and logically compartmentalized.

The data models disclosed herein, and the manner in which the data is populated and removed from them, also help to balance 1) the speed with which a plurality of data formatters can format a common data set (i.e., they can each format the data of the data set in parallel, with 2) the real-world limitations on memory, storage and/or processing resources. In the realm of circuit test, and particulary when conducting parametric test using an SOC tester, so much data is generated the resource limitations of even a well-provisioned computer system can be reached after testing as few as 10-20 chips. However, by using the data models disclosed herein, and removing data objects that are no longer needed, resource limitations can typically be avoided.

What is claimed is:

1. Apparatus, comprising:
    a data populator configured to i) receive an ordered sequence of events corresponding to execution of a plurality of tests on at least one device under test (DUT), ii) create a plurality of data objects, including some data objects that correspond to logical groupings of test results implied by ones of the events, and a generic data object that corresponds to an user-defined event of the sequence of events, iii) relate ones of the data objects to others of the data objects in a hierarchical tree structure, with the generic data object being related to others of the data objects based on the position of the user-defined event in the ordered sequence of events, and iv) relate data corresponding to ones of the events to ones of the data objects in the hierarchical tree structure; and
    a data formatter configured to retrieve and format data associated with the hierarchical tree structure, the data formatter i) retrieving data associated with the generic data object, and ii) formatting the data associated with the generic data object, to generate formatted data that is readable by a user or downstream analysis software.

2. The apparatus of claim 1, wherein the data formatter is configured to format data associated with the generic data object in accord with a generic record type.

3. The apparatus of claim 1, wherein the data formatter is configured to format data associated with the generic data object in accord with an user-defined data record type corresponding to the user-defined event.

4. The apparatus of claim 1, wherein the generic data object further includes a label associated therewith, and wherein the data formatter reads the label associated with the generic data object to determine what kind of format to use when formatting data associated with the generic data object.

5. The apparatus of claim 1, wherein the generic data object further includes a label associated therewith, and wherein the data formatter reads the label associated with the generic data object to determine whether data associated with the generic data object is debug data.

6. The apparatus of claim 1, wherein the generic data object further includes a label associated therewith, and wherein the data formatter reads the label associated with the generic data object to determine whether data associated with the generic data object is related to data associated with other generic data objects.

7. A method, comprising:
    in response to an ordered sequence of events corresponding to execution of a plurality of tests on at least one device under test (DUT),
        creating a plurality of data objects, including i) some data objects that correspond to logical groupings of test results implied by ones of the events, and
    ii) a generic data object that corresponds to an user-defined one of the events;
        relating ones of the data objects to others of the data objects in a hierarchical tree structure, with the generic data object being related to others of the data objects based on the position of the user-defined event in the ordered sequence of events; and
        relating data corresponding to ones of the events to ones of the data objects in the hierarchical tree structure;
    providing a number of data formatters access to the plurality of data objects and data associated with the hierarchical tree structure; and
    formatting the plurality of data objects and data associated with the hierarchical tree structure into formatted data with at least one of the number of data formatters, including, formatting the data associated with the generic data object, to generate formatted data that is readable by a user or downstream analysis software.

8. Apparatus, comprising:
computer readable media; and
computer readable code, stored on the computer readable media, including code, when executed by the apparatus, to,
    in response to receiving an ordered sequence of events corresponding to execution of a plurality of tests on at least one device under test (DUT),
        create a plurality of data objects, including i) some data objects that correspond to logical groupings of test results implied by ones of the events, and ii) a generic data object that corresponds to an user-defined one of the events;
        relate ones of the data objects to others of the data objects in a hierarchical tree structure, with the generic data object being related to others of the data objects based on the position of the user-defined event in the ordered sequence of events; and
        relate data corresponding to ones of the events to ones of the data objects in the hierarchical tree structure;
    provide a number of data formatters access to the plurality of data objects and data associated with the hierarchical tree structure; and
    format the plurality of data objects and data associated with the hierarchical tree structure into formatted data with at least one of the number of data formatters, including, formatting the data associated with the generic data object, to generate formatted data that is readable by a user or downstream analysis software.

* * * * *